United States Patent [19]

Payne et al.

[11] 3,856,578

[45] Dec. 24, 1974

[54] BIPOLAR TRANSISTORS AND METHOD OF MANUFACTURE

[75] Inventors: Richard Steven Payne, Piscataway, N.J.; Robert John Scavuzzo, Bethlehem, Pa.

[73] Assignee: Bell Telephone Laboratories, Incorporated, Murray Hill, N.J.

[22] Filed: July 16, 1973

[21] Appl. No.: 379,408

Related U.S. Application Data

[63] Continuation-in-part of Ser. No. 234,021, March 13, 1972, Pat. No. 3,756,861.

[52] U.S. Cl. .................... 148/1.5, 148/187, 357/90, 357/91

[51] Int. Cl. .................... H01l 7/54

[58] Field of Search .................... 148/1.5, 175, 187; 317/234, 235

[56] References Cited

UNITED STATES PATENTS

| | | | |
|---|---|---|---|
| 3,260,624 | 7/1966 | Wiesner | 148/175 |
| 3,383,567 | 5/1968 | King et al. | 317/234 |
| 3,483,443 | 12/1969 | Mayer et al. | 317/234 |
| 3,589,949 | 6/1971 | Nelson | 148/1.5 |
| 3,595,716 | 7/1971 | Kerr et al. | 148/187 |
| 3,638,300 | 2/1972 | Foxhall et al. | 148/1.5 X |
| 3,729,811 | 5/1973 | Beale et al. | 148/1.5 X |

*Primary Examiner*—L. Dewayne Rutledge
*Assistant Examiner*—J. M. Davis
*Attorney, Agent, or Firm*—L. H. Birnbaum

[57] ABSTRACT

A bipolar transistor is fabricated by a process which involves a two-step base formation and an emitter formed by diffusion or ion implantation. One processing step in forming the base is either a diffusion or ion implantation of impurities which step primarily determines sheet resistivity. The other processing step is an ion implantation which primarily determines doping concentration under the emitter. The resulting composite doping profile has at least one point of inflection and is dominated at the surface region by the impurities introduced by the former step and in the bulk by the impurities introduced by the latter step. The emitter is preferably implanted and then diffused to a depth which locates the emitter-base junction past the portion of the base profile dominated by the impurities determining sheet resistivity.

6 Claims, 12 Drawing Figures

BIPOLAR TRANSISTORS AND METHOD OF MANUFACTURE

CROSS-REFERENCE TO RELATED APPLICATIONS

This application is a continuation-in-part of applicants' copending application Ser. No. 234,021, filed Mar. 13, 1972 now U.S. Pat. No. 3,756,861.

BACKGROUND OF THE INVENTION

This invention relates to the formation of bipolar transistors and in particular to such transistors which are capable of operating at high frequencies, i.e., greater than 500 megacycles.

With the continuing development and future prospects of microwave communications systems, high speed memory and logic devices, as well as the need for low-level detectors and amplifiers for coaxial cable telephone transmission, great interest has been generated in an improved process for fabricating high frequency transistors. at present, these transistors are generally formed by a double-diffusion process. That is, both emitter and base regions are formed by standarad chemical diffusion techniques. Since the chemical diffusion process is difficult to control for transistors which require shallow structures or which require a narrow tolerance on transistor properties, ion implantation offers an attractive alternative doping process. The technique is capable of forming a wide range of impurity concentrations witih a high degree of control of both the impurity concentration and its distribution. Thus, various attempts have been made to fabricate high frequency transistors utilizing ion implantation techniques, either in a double implant wherein both the emitter and base regions are implanted in the semiconductor substrate, or in a hybrid process wherein the base is implanted and the emitter diffused. These attempts, however, have not been satisfactory in uniformly producing high gain, low leakage transistors.

SUMMARY OF THE INVENTION

In accordance with the invention, high frequency transistors are fabricated with improved gain characteristics and yield. Base formation is accomplished by two separate processing steps whose order is interchangeable. In one step, a region of impurities is formed within a semiconductor material by diffusion or ion implantation primarily to determine the sheet resistivity at the surface of the semiconductor. In the other step, impurities are implanted within the same area of the semiconductor material but extend deeper into the bulk than the first region of impurities so that a resultant region is formed with an impurity profile which is dominated at the surface by the impurities determining sheet resistivity and dominated in the bulk by the impurities of the other step. The impurity profile is also characterized by the presence of at least one inflection point. The emitter region is formed by a chemical diffusion or by an ion implantation together with a thermal diffusion of the implanted impurities such that the emitter-base junction is located past the portion dominated by the impurities determining sheet resistivity.

DESCRIPTION OF THE DRAWING

These and other features of the invention will be delineated in detail in the description to follow. In the drawing.

DETAILED DESCRIPTION OF THE INVENTION

FIGS. 1A–1F best demonstrate the method of the present invention. It should be emphasized that these figures are not drawn to scale. Reference will also be made to FIGS. 2A–2D to demonstrate the impurity concentrations of the device at various stages of the process. While the manufacture of a discrete transistor is shown, it should be clear that the invention also applies to the planar batch processing of several transistors on a semiconductor slice and to the manufacture of a transistor as part of an integrated circuit.

Figure 1A:
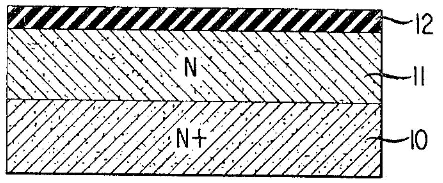
FIGS. 1A–1F are cross-sectional views of a device at various stages of manufacture in accordance with one embodiment of the invention.

In FIG. 1A, a silicon semiconductor substrate, 10, of N+ conductivity type has grown thereon an n-type epitaxial layer, 11, by standard techniques. The substrate is preferably doped with Sb or As impurities to a resistivity of less than or equal to approximately 0.01 ohm-cm, while the n-type layer, which will comprise the collector region of the trnsistor, is preferably doped with As impurities to a resistivity of approximately 1ohm-cm, although a range of at least 0.1 – 10 ohm-cm is useful. The epitaxial layer, 11, is approximately 7$\mu$ thick. A layer of silicon dioxide, 12, is grown or deposited over the semiconductor material to a thickness of approximately 1,400 A, although any oxide thickness would be useful so long as the ion implanted base dopants can still be implanted through the oxide.

The area of the base region is defined by conventional photolithogrpahic techniques. Thus, a layer of photoresist material is deposited over the silicon dioxide layer. The photoresist is exposed to light through a suitable mask, and then developed in a suitable solution so as to define a window in the photoresist for the introduction of base impurities into the semiconductor. This stage is illustrated in FIG. 1B, with the photoresist layer designated as 13. Alternatively, a deposited metal or insulator could be used as a mask in place of the photoresist. The oxide layer is found desirable to reduce surface damage during the subsequent ion implantation.

Figure 1D:
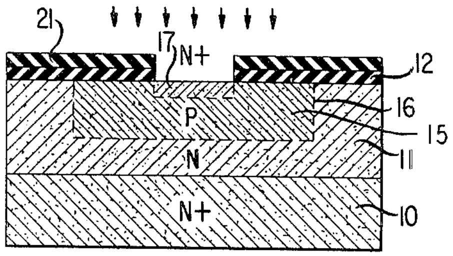
Figure 1B:
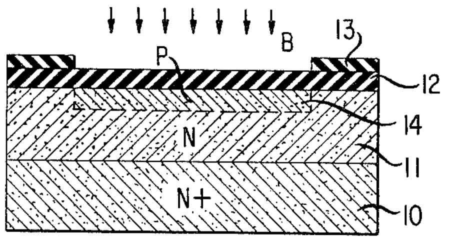
Figure 2A:
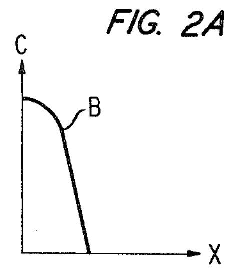
FIGS. 2A–2D are impurity profiles of a device at various stages of manufacture in accordance with the same embodiment.

Referring again to FIG. 1B, the first step in the formation of the base is illustrated. The structure is exposed to a beam of boron ions with an energy of approximately 50 keV so that the boron penetrates the oxide layer, but not the photoresist or mask, to form a region of p-type conductivity, 14, within the semicondcutor layer 11 in the area defined by the photoresist window. The dose of the ion beam used to give the desired sheet resistivity is approximately $2.8 \times 10^{14}$ ions/cm$^2$, although a range of $10^{12} - 5 \times 10^{14}$ ions/cm$^2$ would be appropriate. The impurity profile resulting from the boron implant is illustrated in FIG. 2A, which is a sketch of impurity concentration C. as a function of distance $x$ from the top surface of the semiconductor material. The curve follows a Gaussian distribution with a peak density of approximately $10^{19}$ ions/cm$^3$ at a depth of approximately 0.02$\mu$. In this embodiment, the energy of the ion beam is sufficient to penetrate the oxide layer, but not so deep as to result, when combined with the succeeding steps, in an impurity concentration which is always decreasing past the initial peak density. This will be described in more detail below. An approximate energy range for this implant, predicated on an $SiO_2$ thickness of 1,400 A, is 5 – 100 keV. It should be noted that this region, 14, may also be formed by standard diffusion techniques. In this case, a silicon dioxide layer would be used initially as the diffusion mask, and then there would be regrown an $SiO_2$ layer over the diffused region to reach the point shown in FIG. 1B.

Figure 1E:
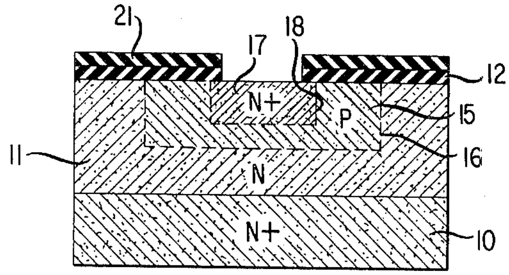
Figure 1C:
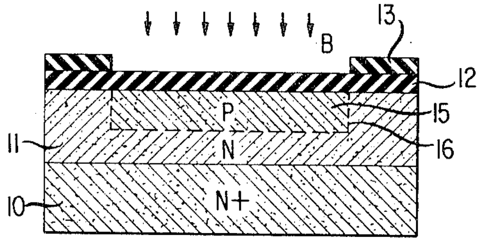

Referring now to FIG. 1C, the second step in the base formation is illustrated. Here, boron ions are again implanted in the region defined by the photoresist window. This implant, however, ultimately determines the doping concentration under the emitter and is usually less than the dosage described in the previous step. In this embodiment, a dosage of $8 \times 10^{12}$ ions/cm$^2$ was utilized, although a range of $8 \times 10^{11} - 5 \times 10^{13}$ ions/cm$^2$ would have been appropriate. The energy of the implanted ions must be sufficient to inject the ions deeper into the bulk than the ions of the previous step, resulting in the composite p-type region, 15, with the collector-base junction indicated by dashed line 16. In this particular embodiment, the energy of the boron beam was approximately 250 keV. An appropriate range of energy for this implant, predicated on an $SiO_2$ thickness of 1,400 A, is 100 – 400 keV.

Figure 2B:
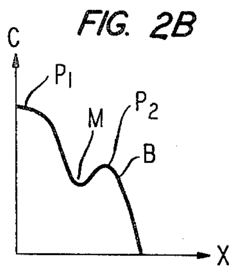

FIG. 2B illustrates the composite doping impurity profile resulting from the two boron implants. The peak density of the lower concentration boron implant is approximately $3 \times 10^{17}$ ions/cm$^3$ and lies at a depth of approximately $0.5\mu$. It is important to note that the impurity concentration in this embodiment comprises two distinct peak values $P_1$ and $P_2$ and a minimum value M. Thus, the energy of the two implants is chosen so that the impurity distributions overlap to prevent formation of an n-region between the two peak values. However, the impurity distributions should not overlap to the extent that no minimum is formed in the area of overlap. Putting it another way, in the area where the higher concentration impurity distribution (shallow implant) overlaps the lower concentration distribution (deep implant), the sum of the distribution must be less than the peak density of the lower concentration implant. Thus, the profiles intersect at a point where the impurity concentration of each implant is less than one-half of the peak concentration of the second implant.

It should be noted that the order of base implantation is reversible and therefore the designation of the implant determining sheet resistivity and the implant determining doping under the emitter as the first and second steps of the process is for illustrative purposes only. Moreover, instead of boron serving both implants, it should be feasible to use other acceptor ions for either or both distributions.

The following the formation of the region 15, the photoresist is stripped off and approximately 5,500 A of additional insulating material is deposited over the $SiO_2$ layer. This layer will serve to reduce the stray capacitance from subsequent contacting electrodes and acts as the mask for the subsequent emitter formation. The insulator is densified at approximately 900° C. for ½ hour, and this treatment also serves to anneal any damage to the semiconductor caused by the base implantations. This anneal step may be deleted if densification of the deposited insulator is not needed for good quality emitter window definition. It will be appreciated by those skilled in the art that during this and subsequent heat treatments, the base profile will spread slightly. At the concentrations and temperatures involved, however, this effect is not significant and for purposes of illustrating individual processing steps, this phenomenon has been ignored in the profile figures. Means for calculating the distribution of boron as a function of temperature and time are well known in the art and hence the precise effect of annealing treatments may be found if desired. All requirements for impurity profiles more strictly refer to the profiles after all heat treatments.

The emitter window is then defined by photolithographic techniques similar to those described in reference to formation of the base region. Here, however, a window is etched through the deposited insulator and initial oxide layers down to the silicon surface and the photoresist is removed prior to implanation. Alternatively, the etching may be halted before the silicon surface is reached, leaving some residual oxide, or insulator-oxide, in the etched area. The unetched portion of the insulator-oxide layers serves as a mask in the subsequent implantation.

Figure 2C:
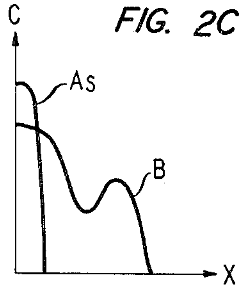

As shown in FIG. 1D, with the additional insulator designated as 21, the device is then bombarded by a beam of arsenic ions which forms a region of N+ conductivity type, 17, in the exposed area of the semiconductor. The dose in this example is $2 \times 10^{16}$ ions/cm$^2$ and the energy of the beam is 150 keV. The dosage of this implant should be sufficiently high so that the n-type impurity distribution compensates for the p-type impurities which were introduced by the high concentration boron implant in the region to serve as the emitter. An appropriate range is therefore $10^{14} - 5 \times 10^{16}$ ions/cm$^2$. The energy is chosen so that the peak density of the As impurty distribution lies near the surface of the semiconductor, i.e., at a depth of approximately 0.01 to $0.2\mu$. Energies may therefore be chosen in the range of 5–450 keV. The impurity profile at this stage in the processing is illustrated in FIG. 2C. In this example, the peak density of the emitter is approximately $10^{21}$ ions/cm$^3$ and is located at a depth of approximately $0.07\mu$.

The emitter region is then annealed at a temperataure and time sufficient to diffuse the arsenic impurities further into the bulk of the material such that the emitter-base junction is located at or near the minimum, M, of the base profile. This is illustrated in FIG. 1E, with the emitter-base junction represented by dashed line, 18, and in FIG. 2D. In particular, FIG. 2D indicates the latitude in junction depth which will still produce optimum gain and frequency response. This latitude in depth, which is represented by $\Delta x$, extends from the minimum in the base profile to the peak of the deeper, lower concentration base implant. Since compensation by the emitter impurities of all impurities from the shallow, higher concentration base implant is desirable, the junction should preferably not be placed on the shallow side of the minimum for best results.

The anneal was performed at 1,000° C. for ½ hour. However, wide variations in this is possible. For example, the anneal may be performed within a range of temperature of 900°–1,300° C. for 5 minutes to 3 hours. It will be noted in reference to FIG. 2D that by diffusing the arsenic impurities, a very abrupt profile is formed. This effect is well known and is due primarily to the fact that the diffusion constant of arsenic is higher at high concentrations than it is at low concentrations. Sb or P could also be used for the emitter impurity, but the profile formed would not be as abrupt. Furthermore, the same sort of profile could be attained if the emitter impurities were introduced into the semiconductor by standard chemical diffusion techniques, i.e., without the initial surface implant. However, the implantation technique provides better control of the impurity distribution since it is not dependent on surface conditions or the vicissitudes of a chemical diffusion process. It should be understood that in this embodiment the emitter region may be formed prior to, as well as after, the formation of the base region.

Figure 1F:
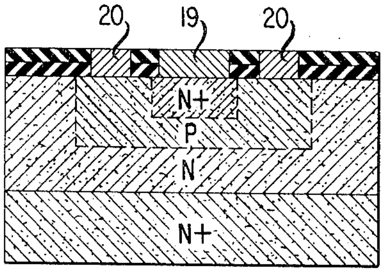

In the final steps, windows are etched through the insulating layers to expose the base region, and metal contacts 19 and 20 are formed by standard techniques to contact the emitter and base regions respectively as illustrated in FIG. 1F.

Figure 3:
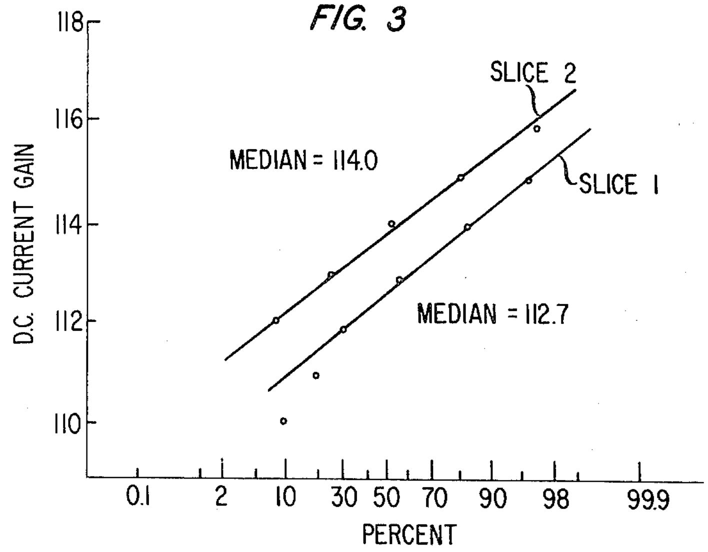
FIG. 3 is a plot of the distribution of DC current gain for several devices manufactured in accordance with the same embodiment.

The uniformity and high gain characteristics achieved by this process can be seen in reference to FIG. 3. This is a plot showing distributions of current gain for several devices batch-processed according to the above-described process on two different slices of semi-conductor material. Twenty-two devices from slice 1 and 25 devices from slice 2 were tested. The graph reveals a remarkable consistency from device to device and slice to slice. The deviation in median current gain of the two slices and the standard deviation in current gain among devices on a slice was only 1.3. This represents a variation of less than 1.2 percent of the median. Other transistor properties, such as the grounded emitter cutoff frequency and base-emitter voltage at fixed collector current, are similarly very uniform. Furthermore, current gain is nearly independent of collector current from 10$\mu$A to 100mA.

Figure 2D:
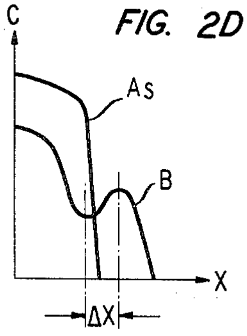

This high degree of uniformity is apparently due to the shape of the base profile and the positioning of the emitter junction as illustrated in FIG. 2D. Current gain is primarily dependent upon the total doping in the base under the emitter (the area of the base curve to the right of the As profile in FIG. 2D). Since the emitter-base junction is located in the area of small base concentration, shifting the location of the junction between minimum and peak density of the second implant results in only a relatively small change in doping under the emitter as compared to prior art diffused or implanted bases where no minimum is formed and the junction lies at a significantly higher base concentration.

While the formation of a base profile with a minimum value is desirable in accordance with the preferred embodiment described above, in the fabrication of very high frequency transistors (i.e., above approximately 3 GHz), this may not be feasible. Nevertheless, such devices with uniform electrical properties can be fabricated in accordance with the general inventive principles outlined previously. For example, the fabrication of devices capable of operating at 8 GHz is described in the following embodiment. Details concerning masking and bonding of the device are essentially the same as in the previous embodiment and are not described here for the sake of brevity.

Figure 4:
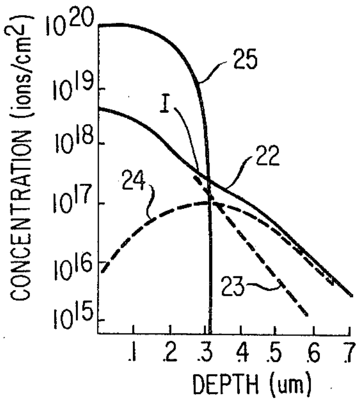
FIG. 4 is an impurity profile of a device in accordance with a further embodiment of the invention.

In terms of device components, this embodiment is essentially identical to that shown in FIGS. 1A–1F. The starting material was a silicon semiconductor substrate of N+ conductivity type and resistivity of less than 0.015 ohm-cm with an n-type epitaxial layer grown thereon with resistivity of approximately 0.8 ohm-cm and a thickness of approximately 3$\mu$. The epitaxial layer surface was masked by a layer of $SiO_2$ approximately 8,000 A thick, with a portion etched to approximately 1,200 A thickness over the area to comprise the base region. In the first step in the base formation, boron impurities were implanted in the epitaxial layer with an ion beam of energy approximately 40 keV and dose of $8.9 \times 10^{13}$ ions/cm$^2$. This produced a region of impurities in the material with a peak density of approximately $5 \times 10^{18}$ ions/cm$^3$ at a depth of about 0.05$\mu$ from the surface. In the fabrication of 3–9 GHz transistors, an appropriate energy range for this implantation with 1,200 A of $SiO_2$ on the surface appears to be 20–50 keV, and a dose range of $10^{13} - 5 \times 10^{14}$ ion/cm$^2$ could be utilized. In the second base formation step, boron ions were implanted into the same area with a beam energy of approximately 160 keV to form the peak density of the impurity profile at about 0.34$\mu$m from the surface. The dose of this implant was approximately $3 \times 10^{12}$ ion/cm$^2$ to determine doping concentration under the emitter. An appropriate energy range predicated on a 1,200 A thick $SiO_2$ layer is 100–200 keV, and an appropriate range of dose is $10^{12} - 2 \times 10^{13}$ ion/cm$^2$. The device was then annealed at 900° C. for approximately 10 minutes. This step is generally not essential. The composite doping profile resulting from these implants can be seen in reference to FIG. 4. The total impurity concentration as a function of depth is illustrated as the solid curve 22, while portions of the impurity profile of the first and second implants which do not alone account for essentially the total profile are shown as broken line curves 23 and 24, respectively. It will first be noted that the composite profile has at least one point of inflection I rather than a minimum value in the region of transition from the surface implant to the deeper implant. While a minimum value would be preferred for the reasons stated previously, this is not usually obtainable with the shallow implants needed for frequency operation above 3 GHz. However, the composite curve follows the general advantage of the invention in that the total base profile is first dominated by the surface implant determining sheet resistivity and then further in the bulk is dominated by the implant ultimately determining doping under the emitter. Thus, if the concentration of impurities as a function of depth for the shallow implant and the deep implant are $C_s(x)$ and $C_d(x)$, respectively, there exists a depth $x_T$ such that for $x < x_T$ $$\int_x^\infty C_s(x)dx > \int_x^\infty C_d(x)dx \qquad (1)$$

and for $x > x_T$ $$\int_x^\infty C_d(x)dx > \int_x^\infty C_s(x)dx. \qquad (2)$$

The functions $C_s(x)$ and $C_d(x)$ for implanted impurities are well known in the art and are therefore not further described here in great detail. Illustratively, a first order approximation of the concentrations of the implants is as follows:

$$C_d(x)=\frac{N_{Id}}{\sqrt{2\pi}\sigma_d}e^{\frac{-(x-R_d)^2}{2\sigma_d^2}} \qquad (3)$$

$$C_s(x)=\frac{N_{Is}}{\sqrt{2\pi}\sigma_s}e^{\frac{-(x-R_s)^2}{2\sigma_s^2}} \qquad (4)$$

where $N_{Id}$ and $N_{Is}$ are the number of ions per $cm^2$ which are implanted by the deep and shallow implants respectively, $R_d$ and $R_s$ are the ranges of the ions of the deep and shallow implants respectively, and $\sigma_d$ and $\sigma_s$ are the standard deviations of the distribution of ions for the deep and shallow implants, respectively, which are Gaussian. $R_d$, $R_s$, $\sigma_d$ and $\sigma_s$ are either known or can be measured for any ion of interest in a particular semiconductor material. The depth $x_T$ which is referred to in the context of this application as the transition point, occurs at about 0.3$\mu$m in this embodiment.

The emitter region is then formed by implanting As impurities into an area within the base region with an ion beam of energy approximately 50 keV and dose approximately $5 \times 10^{15}$ ions/$cm^2$. A useful energy range for this implant is 5–300 keV, and a useful range of dose is $10^{14}$ – $10^{17}$ ions/$cm^2$. Again, the dose of this implant must be sufficiently high so as to compensate for the impurities which were introduced by the high concentration boron implant. The energy is chosen so that the peak density of emitter impurities initially lies near the surface of the semiconductor, i.e., at a depth of approximately 0.01 – 0.1$\mu$m. The emitter region was then annealed at 1,000° C. for 25 minutes to diffuse the emitter impurities further into the bulk. The resulting emitter profile is shown as curve 25 in FIG. 4. It will be seen that the emitter-base junction is formed at about 0.3$\mu$m from the surface. Since it is desired to compensate for the major portion of the high concentration surface implant, the emitter-base junction should be formed at a depth which is equal to or greater than the depth which has been described above as the transition point. This, of course, will insure that the doping under the emitter is composed mainly of the impurities of the deeper implant. A useful range for annealing, therefore, appears to be 900°–1,300° C. temperature for 5 minutes to 3 hours.

In accordance with the above method and prescribed ranges, devices ranging from 3–9 GHz were fabricated. These devices had consistently higher collector to emitter breakdown voltages than prior art diffused devices. The devices also exhibited uniform current gain, typically varying only ±20 percent over 2,000 devices on a single slice of semiconductor material. It will be noted that current gain for these transistors is not as uniform as in the case of the first embodiment described in reference to FIGS. 1A–1F and FIGS. 2A–2D. This is consistent with the theory that very uniform characteristics result from positioning the emitter-base junction at or near the minimum in the base profile. Nevertheless, the transistors made in accordance with the invention do exhibit a uniformity in current gain which is generally superior to prior art devices. It therefore appears desirable to form a composite base profile which, at most, has at least one inflection point in the area of overlap of the two implants. This means that at some depth the second derivative of the composite base profile $C_s(x) + C_d(x)$ will go from negative to postive. This may be contrasted with the typical diffusion impurity distribution wherein the second derivative was always negative. It is also preferred in the formation of these high frequency transistors to form the emitter region only after the formation of the composite base profile.

Various additional modifications will become apparent to those skilled in the art. All such variations and extensions which basically rely on the teachings through which this invention has advanced the art are properly considered within the spirit and scope of the invention. For example, for transistors in which all connections are to be made from a common surface as is characteristic of many transistors embodied in integrated circuits, the N+ substrate shown in FIG. 1 may correspond to the "buried collector" common in many integrated circuits. In such a case, the N+ zone would be simply a localized surface zone enclosed within a P-type region.

What is claimed is:

1. A method of fabricating a transistor comprising the steps of:

exposing a semiconductor zone of one conductivity type to a first ion beam of impurities of opposite conductivity type so as to form a first region of impurities of opposite conductivity type therein;

exposing said zone to a second ion beam of impurities of said opposite conductivity type so as to form a second region of impurities of opposite conductivity type therein over the area of the first region with a peak density which is less than the peak density of the first region and which extends deeper into said zone than the peak density of the first region, said first and second regions of impurities overlapping to form a composite region of impurities comprising the base region which is dominated by the impurities of the first region from the surface of the body to a depth less than $x_t$ and which is dominated by the impurities of the second region at a depth greater than $x_t$ and further wherein there exists at least one point of inflection in the impurity profile of the composite region; and, following the formation of said base region, forming an emitter region of impurities of said one conductivity type within the semiconductor zone within the area defined by said base region by exposing said zone to a third ion beam of impurities of said one conductivity type and subsequently heating said zone to diffuse the impurities further into the bulk of the zone and form the emitter-base junction at a depth which is greater than or equal to $x_t$.

2. The method according to claim 1 wherein the first ion beam comprises boron ions at a dose of $10^{13}$ – $5 \times 10^{14}$ ions/$cm^2$ and energies in the range 20–50 keV.

3. The method according to claim 1 wherein the second ion beam comprises boron ions at a dose of $10^{12}$ – $2 \times 10^{13}$ ions/$cm^2$ and energies in the range 100–200 keV.

4. The method according to claim 1 wherein the third ion beam comprises impurities selected from the group consisting of As, p, and Sb.

5. The method according to claim 1 wherein the third ion beam comprises As ions at a dose of $10^{14}$ – $10^{17}$ ions/$cm^2$ and energies in the range 5–300 keV.

6. The method according to claim 1 wherein the zone is heated to a temperature in the range 900°–1,300° C. for a time in the range 5 minutes to 3 hours.

* * * * *